United States Patent [19]

Takahashi

[11] Patent Number: 5,175,748
[45] Date of Patent: Dec. 29, 1992

[54] WAVEFORM SHAPING CIRCUIT AND RECEIVER USING SAME

[75] Inventor: Jun Takahashi, Saitama, Japan

[73] Assignee: Toko, Inc., Tokyo, Japan

[21] Appl. No.: 476,895

[22] Filed: Feb. 8, 1990

[30] Foreign Application Priority Data

Feb. 16, 1989 [JP] Japan ................................. 1-37010

[51] Int. Cl.⁵ ................... H04L 25/06; H04L 27/22; H03K 9/00
[52] U.S. Cl. ........................................ 375/75; 375/76; 307/358; 328/127; 330/302
[58] Field of Search .............. 307/358, 146, 147, 350; 330/302; 328/149, 127; 364/830; 375/75, 76

[56] References Cited

U.S. PATENT DOCUMENTS 3,688,205  8/1972  Burger ............... 375/76 X
4,339,727  7/1982  Kage et al. ............ 307/358 X Primary Examiner—Curtis Kuntz
Assistant Examiner—Tesfaldet Bocure

[57] ABSTRACT

A waveform shaping circuit is provided which comprises a first and a second integrating circuit to which is applied an input signal having digital data mingled therein; and a differential amplifier having a first input terminal to which the input terminal is applied and a second input terminal to which integrated output derived from the first integrating circuit. The second integrating circuit has its time constant set up to be lower than that of the first integrating circuit; and the first integrating circuit has a capacitor intermittently charged with output derived from the second integrating circuit, so that the input signal is converted to digital data.

9 Claims, 3 Drawing Sheets

FIG. 1
PRIOR ART
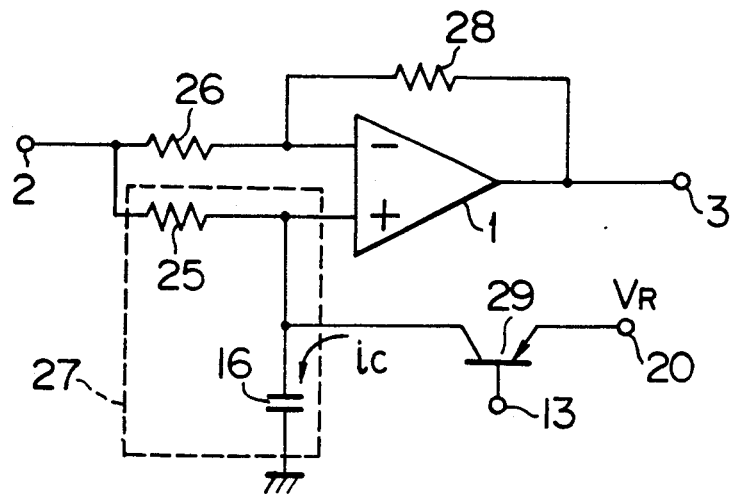
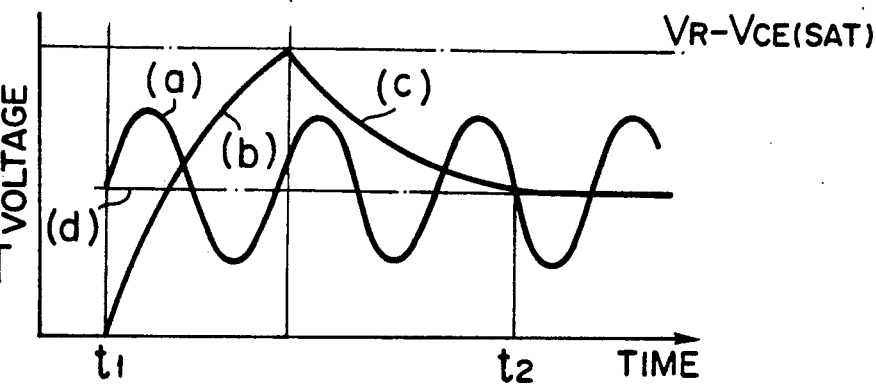

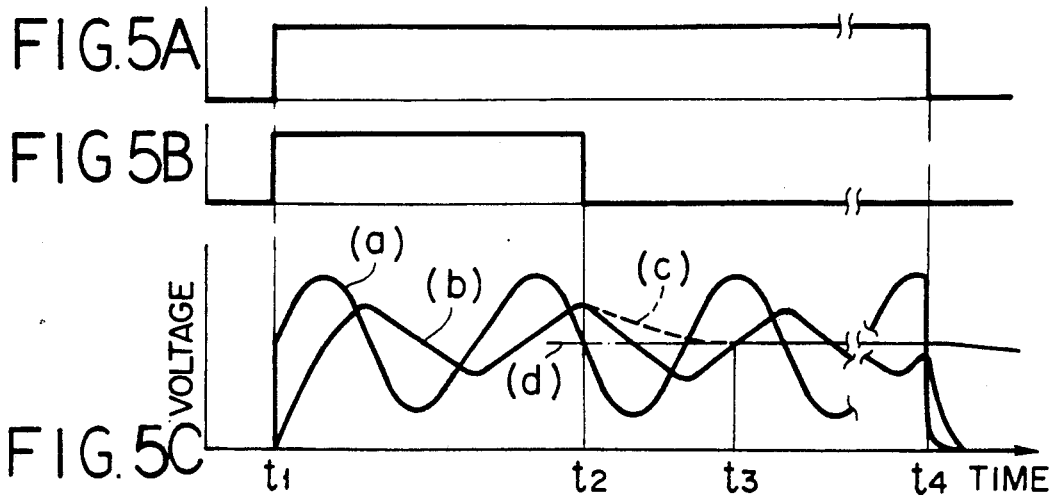
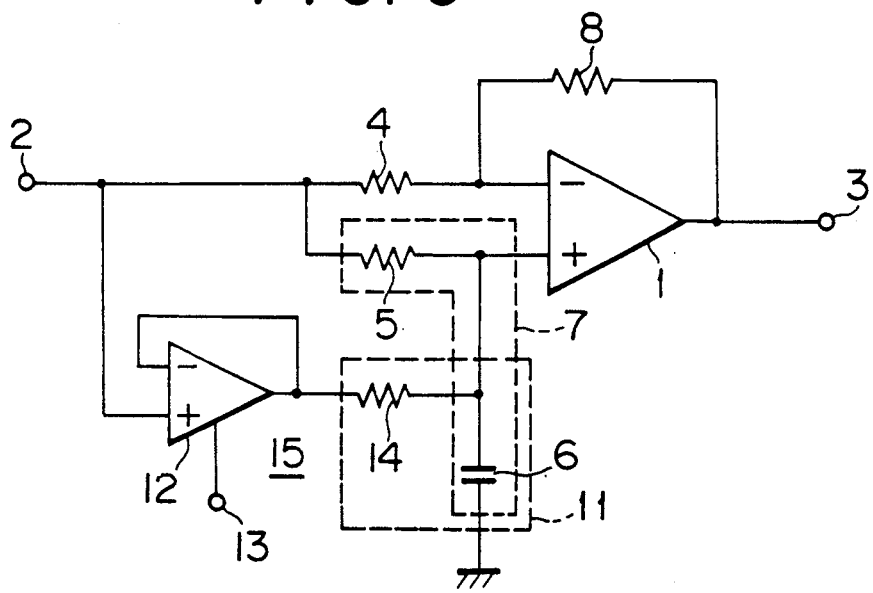
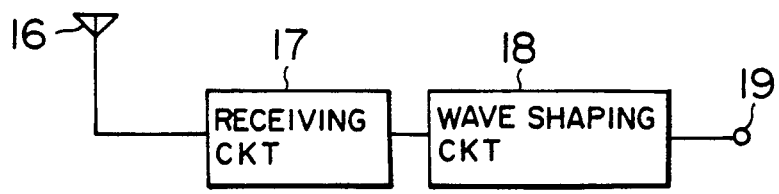

WAVEFORM SHAPING CIRCUIT AND RECEIVER USING SAME

BACKGROUND OF THE INVENTION

1. Field of the Invention

This invention relates to a waveform shaping circuit which is so designed as to intermittently operate and adapted for use with a mobile communication apparatus, and a receiver using such a waveform shaping circuit. More particularly, this invention is directed to such an arrangement with an improved transient characteristic which occurs when an input signal having digital data mingled therewith is subjected to waveform-shaping.

2. Description of the Prior Art

To have a better understanding of the present invention, description will first be made of the prior art with reference to FIGS. 1 and 2 of the accompanying drawings. FIG. 1 is a circuit diagram showing an example of conventional waveform shaping circuit adapted for use with a paging device or the like, wherein reference numeral 2 indicates an input terminal to which is applied an input signal such as a digital data signal having an arbitrary waveform or a digital data signal retaining a relatively square waveform, and reference numeral 3 indicates an output terminal at which is obtained a waveform-shaped digital data signal. Resistors 25 and 26 are connected at one end to the input terminal 2 and also coupled at the opposite end to inverting input terminal and non-inverting input terminal of a differential amplifier 1 which has a feedback resistor 28 connected across the inverting input terminal and output terminal 3 thereof so as to constitute a feedback circuit. A capacitor 16 is coupled to the connection point between the resistor 25 and the non-inverting input terminal of the differential amplifier 1, and the collector of a transistor 29 is also connected thereto. A reference voltage source $V_R$ is connected to a terminal 20 which comprises the emitter of the transistor 29; and a terminal 13 is connected to the base of the transistor 29, and a control signal for boosting charge is applied thereto.

The power source voltage is intermittently applied to a waveform shaping circuit, and the control signal for boosting charge is applied to the terminal 13 in synchronism with turning-on of the power source so that a charging current $i_c$ is supplied to the capacitor 16 through the transistor 19. Input signal is supplied to the non-inverting input terminal of the differential amplifier 1 through the resistor 26. The resistor 25 and capacitor 16 constitute an integrating circuit 27 by which the input signal is smoothed. Such smoothed input signal is passed to the differential amplifier via the non-inverting input terminal so that the input signal is subjected to waveform-shaping.

In the waveform shaping circuit of FIG. 1, input signal is supplied to the input terminal 2. The waveform of the input signal is shown at (a) in FIG. 2(II). When the control signal for boosting charge is applied to the control terminal 13 as shown in FIG. 2(I), the transistor 29 is rendered operative so that the charging current $i_c$ is caused to rapidly flow in the capacitor 16 and thus charging voltage at the capacitor 16 builds up as shown by a charging curve (b). The charging voltage increases up to a value close to a voltage $(V_R - V_{CE(SAT)})$ which is equal to the reference voltage $V_R$ minus the saturation voltage $V_{CE(SAT)}$ of the transistor 29. When the control signal is interrupted, the voltage charged at the capacitor 16 drops down to a voltage level (d) corresponding to the smoothed input signal superimposed upon DC bias voltage, as indicated by a discharge curve (c) (see FIG. 2(II)).

As will be seen from FIG. 2, it is during the time period $t_1$ to $t_2$ that data error tends to occur, and this discharge time period is proportional to the time constant of the integrating circuit 27. With this type of waveform shaping circuit, digital data signal with a constant duty ratio is more stably obtained as the time constant of the integrating circuit 27 is increased. Disadvantageously, however, as the time constant of the integrating circuit 27 increased, the time period ($t_1$ to $t_2$) during which data error tends to occur, i.e., the time period during which the reference voltage level occurring after the boosting charge transiently becomes astable, becomes longer.

SUMMARY OF THE INVENTION

It is a primary object of the present invention to provide a waveform shaping circuit which is so designed that a digital data signal having an arbitrary waveform is rapidly converted into a pulse signal of a substantially uniform duty ratio, thereby minimizing transient fluctuation.

It is another object of the present invention to provide a waveform shaping circuit which so designed that the time period during which data error tends to occur can be shortened as greatly as possible, and a receiver using such a waveform shaping circuit.

Briefly stated, the waveform shaping circuit according to the present invention comprises a differential amplifier having an input terminal to which a first input signal is applied and a second input terminal to which is applied an output obtained by integrating the input signal by means of a first integrating circuit; and a second integrating circuit provided at the front stage of the differential amplifier and having a higher time constant than that of the first integrating circuit, whereby a capacitor of the first integrating circuit is boost-charged with the output of the second integrating circuit so that the charge-discharge period of the capacitance is shortened so as to minimize occurrence of data error, and thus the waveform shaping circuit is well adapted for use with a receiver such as pager or the like.

Other objects, features and advantages of the present invention will become apparent from the ensuing description taken in conjunction with the accompanying drawings.

BRIEF DESCRIPTION OF THE DRAWINGS

FIG. 1 is a circuit diagram showing an example of conventional waveform shaping circuit.

FIG. 2 is a view useful for explaining the operation of the conventional waveform shaping circuit.

FIG. 5 is a view useful for explaining the operation of the waveform shaping circuit according to the present invention.

FIG. 6 is a circuit diagram showing the waveform shaping circuit according to a second embodiment of the present invention.

FIG. 7 is a block diagram showing a receiver using the waveform shaping circuit of the present invention.

DESCRIPTION OF THE PREFERRED EMBODIMENTS

Figure 3:
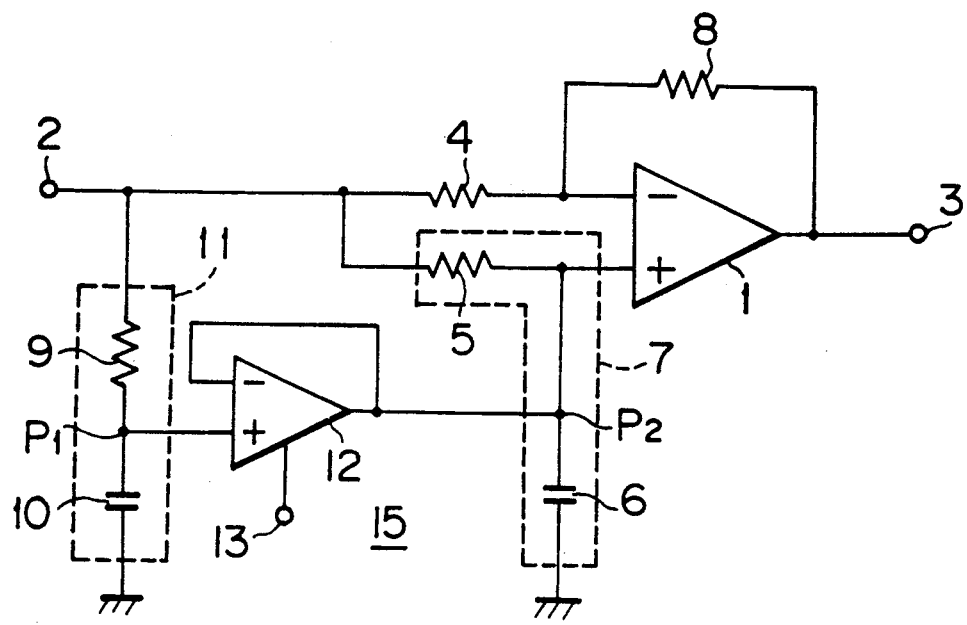
FIG. 3 is a circuit diagram showing the waveform shaping circuit according to an embodiment of the present invention.

Referring to FIG. 3, there is shown the waveform shaping circuit according to an embodiment of the present invention, wherein resistors 4, 5 and 9 are connected at one end to an input terminal 2 to which an input signal superimposed upon a DC bias voltage is applied, the resistors 4 and 5 being connected at the other end to inverting input terminal and non-inverting input terminal of a differential amplifier 1, and a feedback resistor 8 is connected across the inverting input terminal and output terminal 3 of the differential amplifier. The resistor 5 is connected at the opposite end to a capacitor 6, so that an integrating circuit 7. The resistor 9 is connected at the other end to a capacitor 10, so that an integrating circuit 11 is constituted by the resistor 9 and capacitor 10. The connection point $P_1$ between the resistor 9 and the capacitor 10 is coupled to an non-inverting input terminal of a differential amplifier 12 which constitutes a voltage-follower type buffer circuit, and inverting input terminal and output terminal of the differential amplifier 12 are connected together and tied to the connection point $P_2$ between the resistor 5 and the capacitor 6. The differential amplifier 12 includes a control terminal 13 to which is applied a control signal for effecting boost-charging. Further, the integrating circuit 11 and differential amplifier 12 constitute a boost-charging circuit for boost-charing the capacitor 6. Indicated at 3 is an output terminal at which a shaped pulse waveform is obtained.

Figure 4:
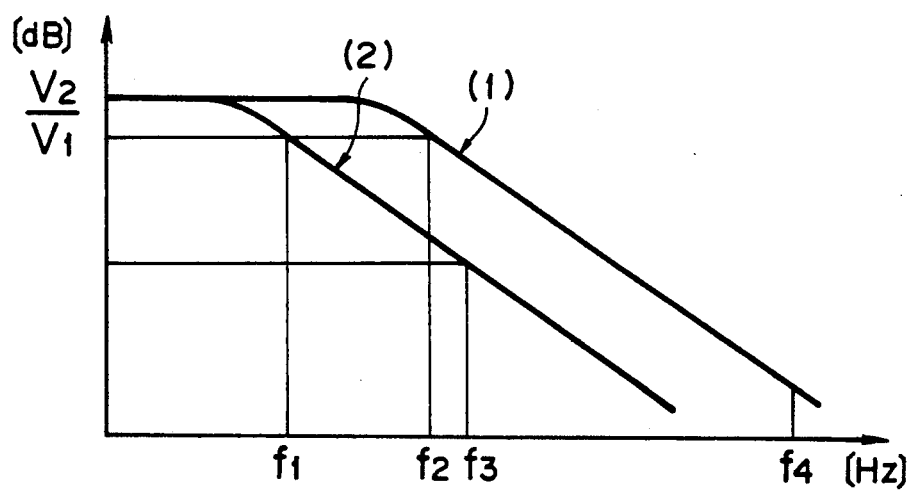
FIG. 4 is a view illustrating the frequency characteristic of an integrating circuit.

Referring to FIG. 4, there is illustrated the frequency characteristic of the integrating circuits 7 and 11, wherein the abscissa indicates the frequency of input signal, and the ordinate indicates the amplitude ratio of the input voltage $V_1$ of the integrating circuit to output voltage $V_2$ thereof; $f_1$ and $f_2$ are cut-off frequencies of the integrating circuits 7 and 11 respectively; $f_3$ is the minimum frequency of the input signal; and $f_4$ is the maximum frequency of input signal. Description will be made of the integrating circuit with reference to the drawings.

If the resistance value for the feedback resistor 8 is made to be infinite, then such a signal that the amplitude ratio ($V_2/V_1$) of input voltage to output voltage is unity, is applied to the inverting terminal of the differential amplifier 1. For waveform-shaping the input signal into an output pulse having a uniform duty ratio, it is required that the amplitude level of the input signal applied to the non-inverting input terminal of the differential amplifier 1 be a more precisely smoothed output of integration. More specifically, for boosting charge of the capacitor 6, it is required that the cut-off frequency $f_2$ for the time constant $C_{10}R_9$ of the integrating circuit 11 be set to be lower than the frequency of the input signal.

The integrating circuits 7 and 11 comprise the resistor 5 and capacitor 6 and the resistor and capacitor 10 respectively, and their time constants $C_6R_5$ and $C_{10}R_9$ are set as follows:

$$C_6R_5 > C_{10}R_9 \quad (1)$$

where $R_5$ and $R_9$ are the resistance values for the resistors 5 and 9 respectively, and $C_6$ and $C_{10}$ are the capacitance values for the capacitors 6 and 10 respectively.

The frequency characteristics of the integrating circuits 11 and 7 are as shown at (1) and (2) in FIG. 4 respectively, and the relationship between the integrating circuits 7 and 11 can be represented in terms of cut-off frequencies $f_1$ and $f_2$ as follows:

$$f_1 < f_2 \quad (2)$$

The time constant $C_{10}R_9$ of the integrating circuit 11 may be set up in consideration of a frequency $f_3$ at which the input signal becomes minimum. More specifically, the time constant $C_{10}R_9$ of the integrating circuit 11 is set up so that the following relationship holds between the cutoff frequency $f_2$ for the time constant $C_{10}R_9$ of the integrating circuit 11 and the frequency $f_3$ at which the input signal becomes minimum:

$$f_2 < f_3 \quad (3).$$

The cutoff frequencies $f_1$ and $f_2$ of the integrating circuits 7 and 11 are given as follows:

$$f_1 = \tfrac{1}{2}\pi C_6 R_5$$

$$f_2 = \tfrac{1}{2}\pi C_{10} R_9.$$

Needless to say, the waveform shaping circuit according to the present invention can operate even when with the cutoff frequency $f_2$ as reference, the following relationship holds between the minimum and maximum frequencies $f_3$ and $f_4$ of the input signal:

$$f_3 < f_2 < f_4 \quad (4).$$

Description will now be made of the operation of the waveform shaping circuit set up as mentioned above.

As shown in FIG. 5 (I), the waveform shaping circuit is provided with power source voltage to be rendered operative during the time period from $t_1$ to $t_4$; and during the time period from $t_1$ to $t_2$, control signal is applied for boosting charge in synchronism with an intermittent receiving signal (see FIG. 5(II)). In this case, the waveform of the input signal at the input terminal 2 turns out to be as shown at (a) in FIG. 5(III). At connection point $P_1$ in the integrating circuit 11, there appears a waveform resulting from integration of the input signal and building up from zero potential. The output amplitude of the integrating circuit 11 turns out to be attenuated relative to the input signal in accordance with the frequency characteristic of the integrating circuit 11. The voltage at the point $P_1$ in the integrating circuit 11 is charged at the capacitor 6 through the differential amplifier 12, which is adapted to function as a buffer circuit for boosting charge, so that waveform occurring at point $P_2$ during the charging period ($t_1$ to $t_2$) turns out to be as shown at (b). At the time point $t_2$ when the control signal is interrupted, the waveform occurring at the point $P_2$ drops depicting a discharge curve such dotted curve (c). Subsequently, the potential at the point $P_2$ reaches a level (d) corresponding to smoothed input signal superimposed upon DC bias voltage at the time point $t_3$, and the input signal is subjected to waveform-shaping so that from the time point $t_3$ onward, there is provided a pulse output having uniform duty ratio. With the conventional waveform shaping circuit, discharge starts with the voltage ($V_R - V_{CE(SAT)}$), whereas according to the present invention discharge of the capacitor starts with the level of the signal attenuated by the integrating circuit 11, so that the discharge time (t2 to t3) can be shortened. The time constant of the integrating circuit 7 is higher than that of the integrating circuit 11 as mentioned above; thus, the integrating circuit 7 performs slower integrating operation and provides, as reference voltage, an integration output corresponding to the input signal level to the non-inverting input terminal of the differential amplifier 1. In this way, the time period during which data error tends to occur, can be shortened.

Referring to FIG. 6, there is shown the waveform shaping circuit according to another embodiment of the present invention. Wherein the arrangement of boost charge circuit 15 is different from that of the embodiment shown in FIG. 3; input terminal 2 is connected to input terminal of differential amplifier circuit 12 adapted to serve as a voltage-follower type buffer circuit; and output terminal is connected to a resistor 14 the other end of which is connected to a capacitor 6. The resistor 14 and capacitor 6 constitute an integrating circuit 11. The capacitor 6 is shared by another integrating circuit 7. The difference between the time constants of the integrating circuits 7 and 11 depends on the difference between the resistance values for the resistors 5 and 14. The remainder of the circuit shown in FIG. 6 is the same as that of the embodiment shown in FIG. 3.

While integrating circuits are used in the waveform shaping circuits according to the embodiments of FIGS. 3 and 6, it is also possible that use may be made of rectifying-smoothing circuits instead of such integrating circuits.

FIG. 7 is a block diagram showing an example of receiver using the waveform shaping circuit according to the present invention, which includes an antenna 16; a tuning and receiving circuit 17 comprising a detector circuit and so forth; a waveform shaping circuit 8 provided after the receiving circuit 17; and an output terminal 19 at which is obtained a waveform-shaped digital data signal which in turn is decoded. A pulsating digital data signal being transmitted is received and converted into a digital signal in the waveform shaping circuit 18.

As will be appreciated from the above discussion, the waveform shaping circuit according to the present invention comprises two types of integrating circuits having different time constants which are connected to one of the input terminals of the differential amplifier, to the other input terminal of which an input signal is applied. The integrating circuit having the lower time constant attenuates the input signal; the output voltage of this integrating circuit is applied to the capacitor of the integrating circuit having the higher time constant to effect boost-charging of the capacitor, thereby minimizing transient fluctuation in the integrating circuit during intermittent operation. In this way, it is possible to shorten the time period during which data error tends to occur due to transient fluctuation resulting from the charging and discharging of the capacitor. Thus, the waveform shaping circuit according to the present invention is well adapted for use with a receiver such as pager or the like.

While the present invention has been illustrated and described with respect to specific embodiments thereof, it is to be understood that the present invention is by no way limited thereto but encompasses all changes and modifications which will become possible within the scope of the appended claims.

I claim:

1. A waveform shaping circuit, comprising a first integrating circuit to which is applied an input signal superimposed upon a DC bias voltage; a differential amplifier having a first input terminal to which said input signal is applied and a second input terminal to which is applied an integrated output derived from said first integrating circuit; and a second integrating circuit to which said input signal is inputted, wherein a capacitor of said first integrating circuit is boost-charged with the output of said second integrating circuit.

2. A waveform shaping circuit, comprising a first integrating circuit to which an input signal is applied; a differential amplifier having a first input terminal to which said input terminal is applied and a second input terminal to which is applied an integrated output derived from said first integrating circuit; and a second integrating circuit for charging a capacitor of said first integrating circuit and having a lower time constant than said first integrating circuit.

3. A waveform shaping circuit, including a first integrating circuit to which an input signal is applied, said first integrating circuit comprising a first resistor and a first capacitor; a differential amplifier having a first input terminal to which said input signal is applied and a second input terminal to which is applied integrated output derived from said first integrating circuit; a second integrating circuit to which said input signal is applied, said second integrating circuit comprising a second resistor and a second capacitor; and a buffer circuit having an input terminal connected to a connection point between said second resistor and said second capacitor and an output terminal connected to a connection point between said first resistor and said first capacitor, said buffer circuit having an input terminal to which is applied a control signal for boosting charge in synchronism with intermittent application of a power source voltage.

4. A waveform shaping circuit, comprising a first integrating circuit to which an input signal is applied; a differential amplifier having a first input terminal to which said input signal is applied and a second input terminal to which is applied integrated output derived from said first integrating circuit; and a buffer circuit to which said input signal is applied, said buffer circuit having an input terminal to which is applied a control signal for boosting charge in synchronism with intermittent turning-on of a power source voltage, wherein a resistor connected at a first end to output terminal of said buffer circuit is connected at a second end to a connection point between a resistor and a capacitor which constitute said first integrating circuit.

5. A receiver comprising a receiving circuit including a tuning circuit; and a waveform shaping circuit comprising a first integrating circuit to which is applied an input signal having an arbitrary waveform, a differential amplifier having a first input terminal to which said input signal is applied and a second input terminal is applied integrated output derived from said first integrating circuit, a second integrating circuit to which said input signal is applied, said second integrating circuit having a lower time constant than said first integrating circuit, wherein a capacitor of said first integrating circuit is boost-charged with output of said second integrating circuit, and said input signal is converted to digital data; said waveform shaping circuit being provided after said receiving circuit.

6. A waveform shaping circuit including an input terminal to which is applied a digitally modulated analog signal, a first integrating circuit connect to said input terminal, and a differential amplifier having a first and a second input terminal and arranged such that the input signal at said input terminal is applied to said first input terminal and an integrated signal derived from said integrating circuit is applied to said second input terminal, the improvement comprising a boost-charging circuit constituted by a second integrating circuit and a second differential amplifier having a control terminal to which is applied a control signal for effecting boost-charging, said boost-charging circuit being arranged such that output thereof is supplied to said first integrating circuit, said second integrating circuit having a lower time constant than that of said first integrating circuit.

7. A waveform shaping circuit according to claim 6, wherein the output of said second integrating circuit is applied to said first integrating circuit through said second differential amplifier.

8. A waveform shaping circuit according to claim 6, wherein output of said second differential amplifier is applied via said second integrating circuit to said first integrating circuit sharing a capacitor with said second integrating circuit.

9. A waveform shaping circuit according to any one of claims 6 to 8, wherein said second differential amplifier comprises a voltage-follower type buffer circuit.

* * * * *